(12) United States Patent
de la Cruz

(10) Patent No.: US 11,737,245 B2
(45) Date of Patent: Aug. 22, 2023

(54) AIR FLOW CONTROL IN DATA STORAGE SYSTEMS

(71) Applicant: Seagate Technology LLC, Cupertino, CA (US)

(72) Inventor: Angel Castillo de la Cruz, Pierce, CO (US)

(73) Assignee: Seagate Technology LLC, Fremont, CA (US)

( * ) Notice: Subject to any disclaimer, the term of this patent is extended or adjusted under 35 U.S.C. 154(b) by 682 days.

(21) Appl. No.: 16/795,859

(22) Filed: Feb. 20, 2020

(65) Prior Publication Data

US 2021/0267091 A1  Aug. 26, 2021

(51) Int. Cl.
| H05K 7/20 | (2006.01) |
| F04D 17/16 | (2006.01) |
| F04D 29/42 | (2006.01) |
| F04D 27/00 | (2006.01) |

(52) U.S. Cl.
CPC .......... *H05K 7/20736* (2013.01); *F04D 17/16* (2013.01); *F04D 27/002* (2013.01); *F04D 29/4213* (2013.01); *H05K 7/20136* (2013.01); *H05K 7/20145* (2013.01); *H05K 7/20181* (2013.01); *H05K 7/20563* (2013.01)

(58) Field of Classification Search
CPC .......... H05K 7/20136; H05K 7/20145; H05K 7/20181; H05K 7/20563; H05K 7/20736; H04D 27/002; F04F 17/16; F04D 28/4213
USPC ................................. 454/184, 278
See application file for complete search history.

(56) References Cited

U.S. PATENT DOCUMENTS

| 5,475,562 | A | * | 12/1995 | Gow .................. H05K 7/20172 165/122 |
| 5,793,610 | A | | 8/1998 | Schmitt et al. |
| 5,890,959 | A | * | 4/1999 | Pettit .................... H05K 7/2019 137/849 |
| 5,921,862 | A | | 7/1999 | Ucciardi |
| 6,005,770 | A | | 12/1999 | Schmitt |
| 6,011,689 | A | | 1/2000 | Wrycraft |
| 6,031,717 | A | | 2/2000 | Baddour et al. |
| 6,174,232 | B1 | | 1/2001 | Stoll et al. |
| 6,554,698 | B2 | | 4/2003 | Kranzdorf et al. |
| 6,705,833 | B2 | | 3/2004 | Tam et al. |
| 6,837,785 | B2 | | 1/2005 | Soderlund |
| 7,025,086 | B2 | | 4/2006 | Maeda et al. |
| 8,007,228 | B2 | | 8/2011 | Wang |
| 8,057,161 | B2 | | 11/2011 | Seidler |
| 8,414,368 | B2 | | 4/2013 | Hansen et al. |
| 8,851,831 | B2 | | 10/2014 | Sun |
| 8,897,009 | B2 | | 11/2014 | Janes et al. |
| 9,612,028 | B2 | * | 4/2017 | Chua ........................ F24F 7/06 |
| 9,777,736 | B2 | | 10/2017 | Shih et al. |
| 10,420,250 | B2 | | 9/2019 | Fuke et al. |
| 2003/0168103 | A1 | | 9/2003 | Onstenk et al. |
| 2004/0060593 | A1 | | 4/2004 | Onstenk et al. |
| 2004/0129410 | A1 | | 7/2004 | Soderlund |

(Continued)

*Primary Examiner* — Avinash A Savani
*Assistant Examiner* — Dana K Tighe
(74) *Attorney, Agent, or Firm* — Faegre Drinker Biddle & Reath LLP

(57) ABSTRACT

A cooling assembly includes an air mover and a vent panel coupled to the air mover. The vent panel includes an inlet. The cooling assembly includes a vane that is rotatable around a central vertical axis of the vane between an open position and a closed position to open and close the inlet.

19 Claims, 8 Drawing Sheets

(56) References Cited

U.S. PATENT DOCUMENTS

| | | | |
|---|---|---|---|
| 2006/0199498 A1* | 9/2006 | Shipley | G06F 1/20 |
| | | | 454/184 |
| 2007/0134110 A1 | 6/2007 | Lin et al. | |
| 2008/0233861 A1 | 9/2008 | Jenkins et al. | |
| 2011/0028081 A1 | 2/2011 | Hopkins et al. | |
| 2011/0259550 A1 | 10/2011 | Komaba et al. | |
| 2012/0190289 A1 | 7/2012 | Wei | |
| 2013/0258591 A1 | 10/2013 | Sun et al. | |
| 2013/0260665 A1* | 10/2013 | Sun | H05K 7/20181 |
| | | | 454/184 |
| 2013/0324025 A1 | 12/2013 | Peng et al. | |
| 2015/0253781 A1* | 9/2015 | Ashton | F16K 15/033 |
| | | | 454/256 |
| 2017/0042061 A1 | 2/2017 | Chen et al. | |

* cited by examiner

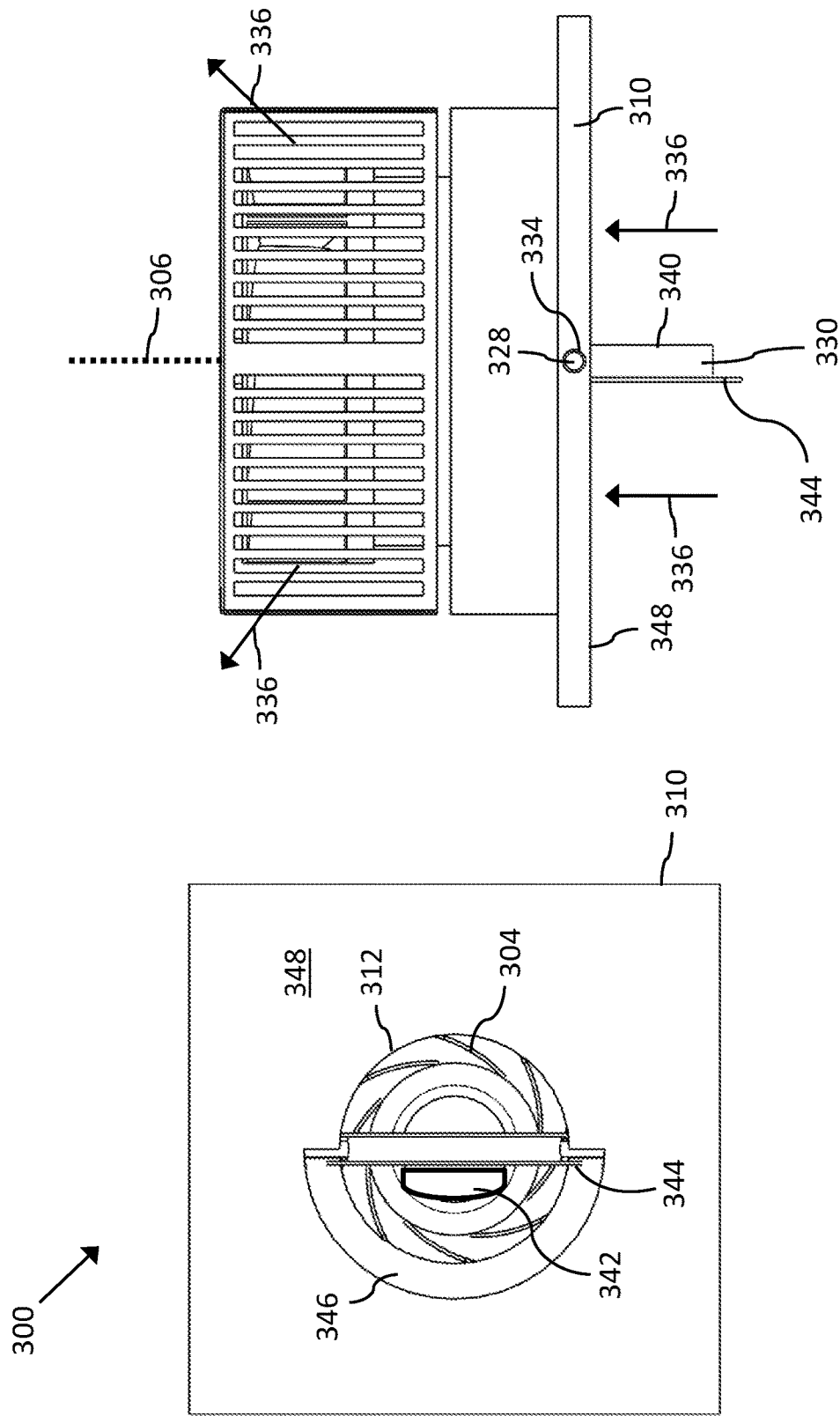

AIR FLOW CONTROL IN DATA STORAGE SYSTEMS

SUMMARY

In certain embodiments, a cooling assembly includes an air mover, a vent panel coupled to the air mover and including an inlet opening, and a vane rotatable around a central vertical axis of the vane between an open position and a closed position to open and close the inlet opening.

In certain embodiments, a system includes an enclosure and a first cooling assembly coupled to the enclosure. The first cooling assembly includes a first air mover, a first vent panel coupled to the first air mover and including a first inlet opening, and a first vane rotatable around a first shaft between a first open position and a first closed position to open and close the first inlet opening.

In certain embodiments, a method is disclosed for using a cooling assembly, which includes an air mover, a vent panel with an inlet opening, and a vane rotatable between an open position and a closed position to open and close the inlet opening. The method includes powering the air mover to pull air through the inlet opening on both sides of the vane in the open position. The method further includes rotating the vane around a central vertical axis of the vane to the closed position such that the vane closes the inlet opening.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIG. 9 shows a front view of the cooling assembly of FIGS. 4-8 in the open position, in accordance with certain embodiments of the present disclosure.

FIG. 10 shows a top view of the cooling assembly of FIGS. 4-9 in the open position, in accordance with certain embodiments of the present disclosure.

Figure 1:
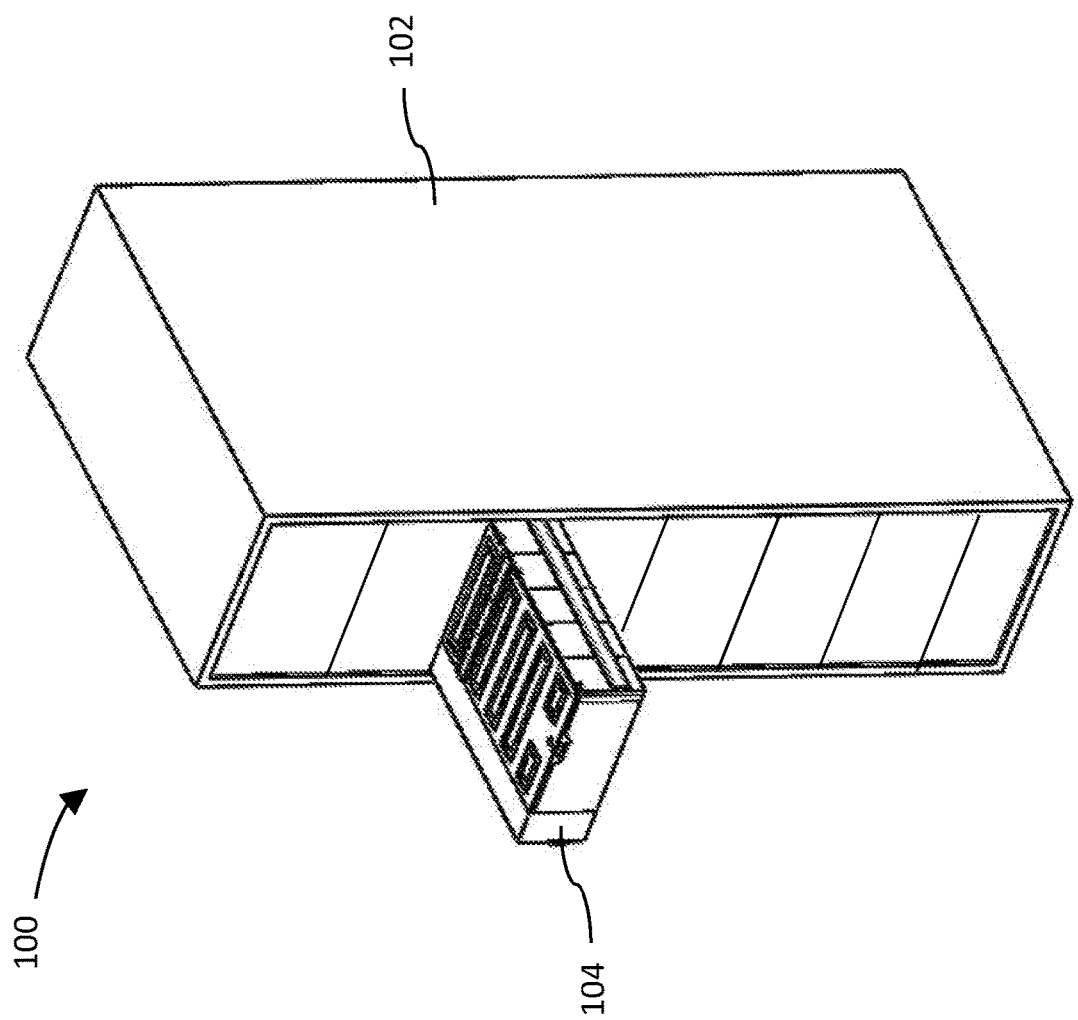
FIG. 1 shows a perspective view of a data storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Data storage systems utilize cooling devices such as air movers (e.g., fans, blowers) to keep components of the data storage systems within a desired operating range. When one of the air movers fails, the total volume of air flow is reduced, and the failed air mover exposes an open circuit through which unwanted backflow of air can enter the data storage systems. This open circuit can further reduce the total volume of air flow within the data storage system.

Currently, to compensate for the reduced air flow, data storage systems typically increase the speed at which the still-functioning air movers rotate and/or use motorized mechanisms to close the open circuit. However, these approaches require that the failure be detected (which may require additional components like sensors), require motorized mechanisms, and/or assume that increasing the speed of the other air movers can adequately compensate for the reduced air flow until the failed air mover can be replaced by a functioning air mover. Other approaches involve using flap- or wing-like structures that—with gravity—close when there is no positive air flow. However, approaches that rely on gravity require the air mover to use more power keep the flaps or wings open to overcome the force of gravity which reduces the efficiency of the air mover. Certain embodiments of the present disclosure are accordingly directed to approaches for helping to prevent backflow of air when air movers fail or otherwise malfunction.

FIG. 1 shows a data storage system 100 including a rack 102 (e.g., a cabinet) with a plurality of enclosures 104. Each enclosure 104 can include multiple drawers or storage levels (each of which may be considered separate enclosures or sub-enclosures) that house electronic devices such as data storage devices installed within the drawers or storage levels. Each enclosure 104 itself can be arranged in a drawer-like fashion to slide into and out of the rack 102, although the enclosures 104 are not necessarily arranged as such.

Figure 2:
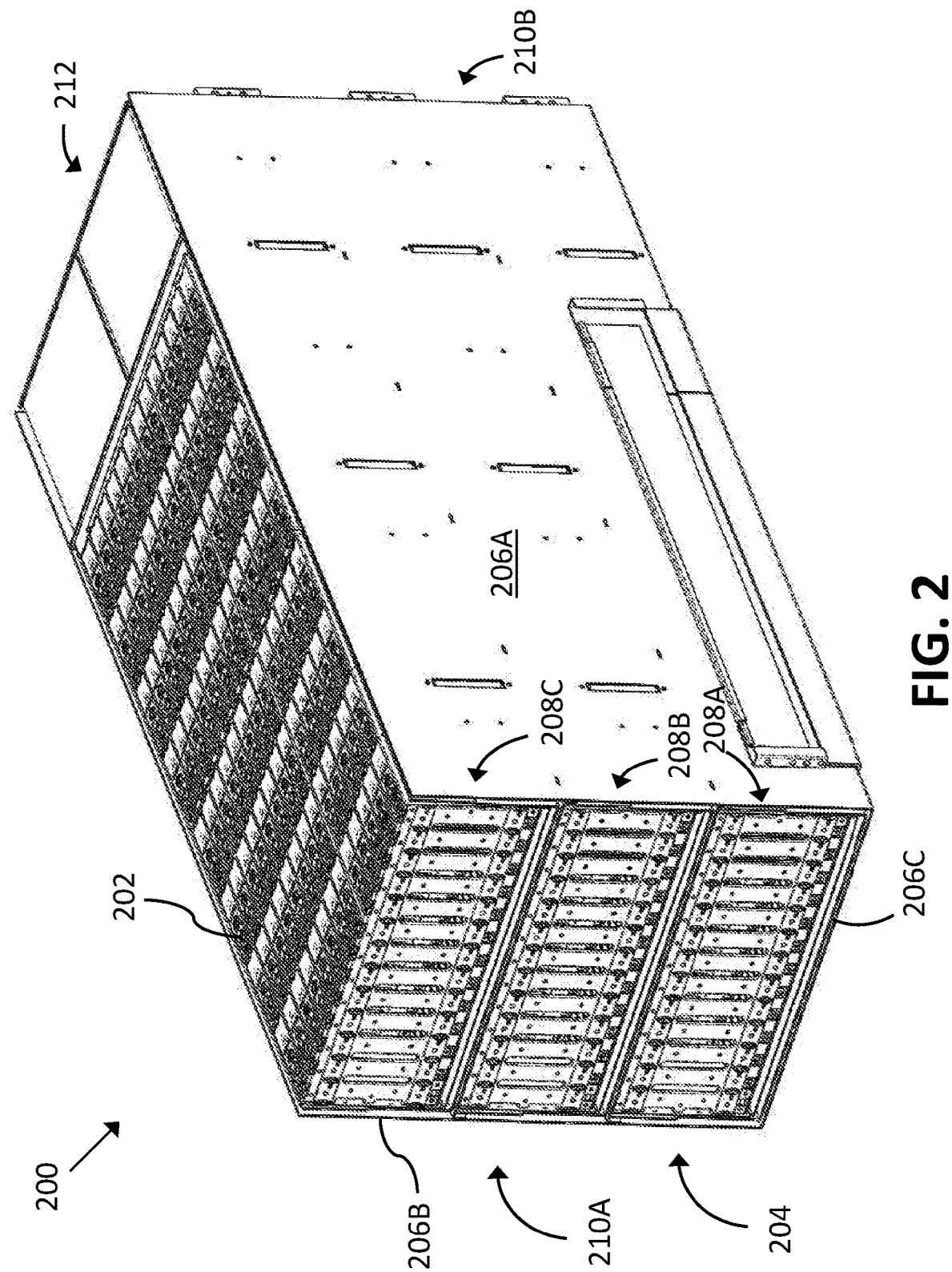
FIG. 2 shows a perspective view of an enclosure, in accordance with certain embodiments of the present disclosure.

FIG. 2 shows an enclosure 200, which can be utilized in a data storage system such as the data storage system 100 of FIG. 1. For example, a rack—such as the rack 102 in FIG. 1—can include multiple individual enclosures, such as the enclosure 200. The enclosure 200 is arranged to secure data storage devices 202 (e.g., hard disk drives and/or solid state drives), various electronics (e.g., power supplies), and cooling devices (e.g., air movers) among other things.

The enclosure 200 includes a chassis 204 with a first side wall 206A, a second side wall 206B, and a bottom wall 206C. The chassis 204 may also include front and rear walls along with a top cover to enclose the data storage devices 202 within the enclosure 200. As shown in FIG. 2, the enclosure 200 can include multiple data storage levels 208A-C each with multiple rows of data storage devices 202. Each data storage level 208A-C may be arranged to slide into and out of the enclosure 200 in a drawer-like fashion. Further, each data storage level 208A-C can form its own enclosure such that the enclosure 200 can be considered to include multiple, smaller enclosures arranged to slide into and out of the enclosure 200. The enclosure 200 includes a front end 210A and a back end 210B with a cooling area 212 at the back end 210B of the enclosure 200.

Figure 3:
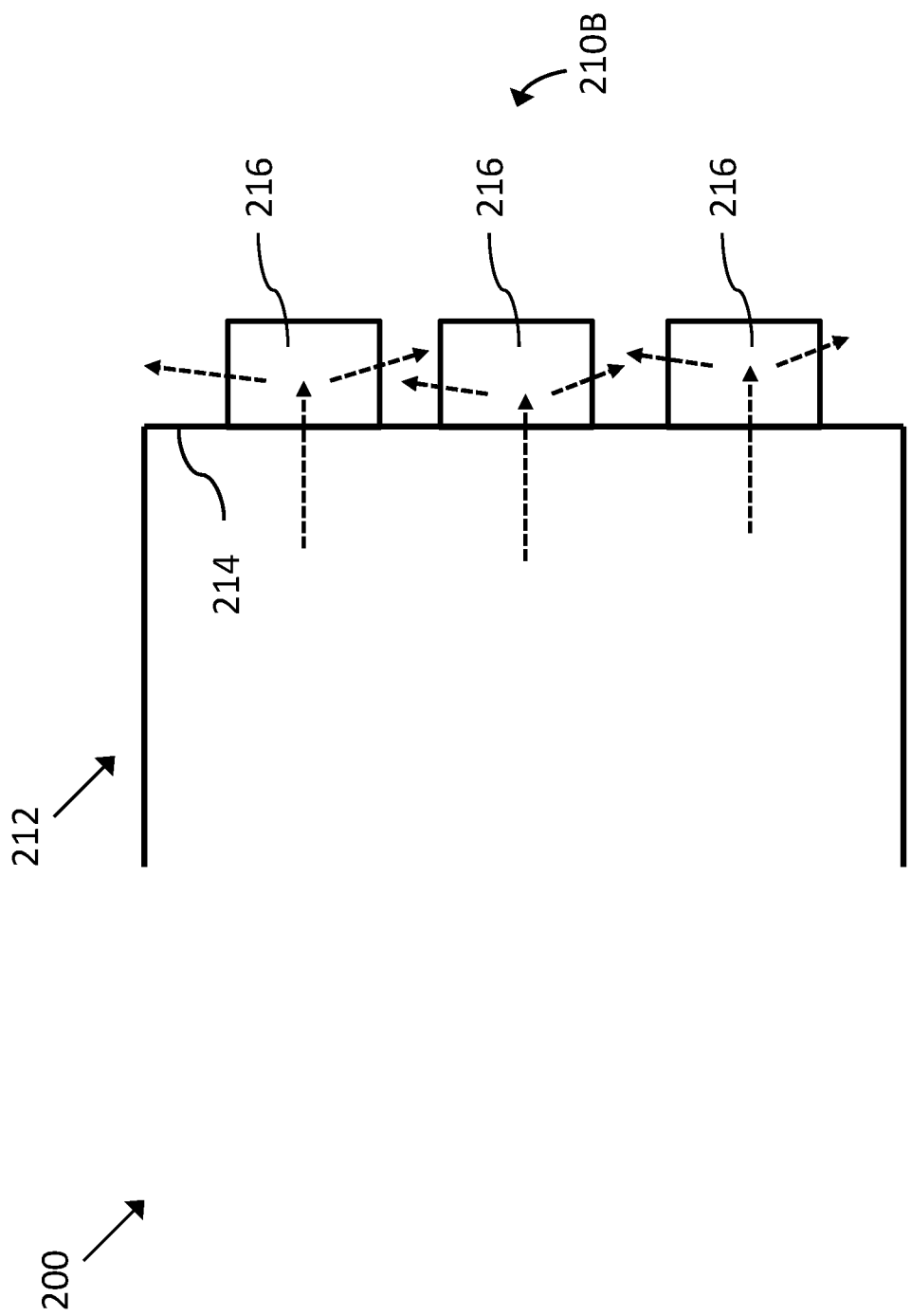
FIG. 3 shows a partial, cutaway view of a back end of the enclosure of FIG. 2, in accordance with certain embodiments of the present disclosure.

FIG. 3 shows a cutaway, schematic side view of the back end 2106 of the enclosure 200. The enclosure 200 includes a back wall 214 on which several cooling assemblies 216 are positioned. Exemplary cooling assemblies and their various features are shown in FIGS. 4-10 and described in additional detail below. In short, the cooling assemblies 216 are arranged to pull air from the front end 210A of the enclosure 200 towards the back end 2106 of the enclosure 200. As the air moves within the enclosure 200, the air cools the various electronic devices positioned within the enclosure 200. The cooling assemblies 216 shown in FIG. 3 are coupled to the back wall 214 of the enclosure 200 such that all or a majority of each of the cooling assemblies 216 is positioned outside the enclosure 200. The dotted arrows in FIG. 3 represent air flowing into the cooling assemblies 216 from the interior of the enclosure 200 and exiting the cooling assemblies 216 along generally radial directions.

Figure 4:
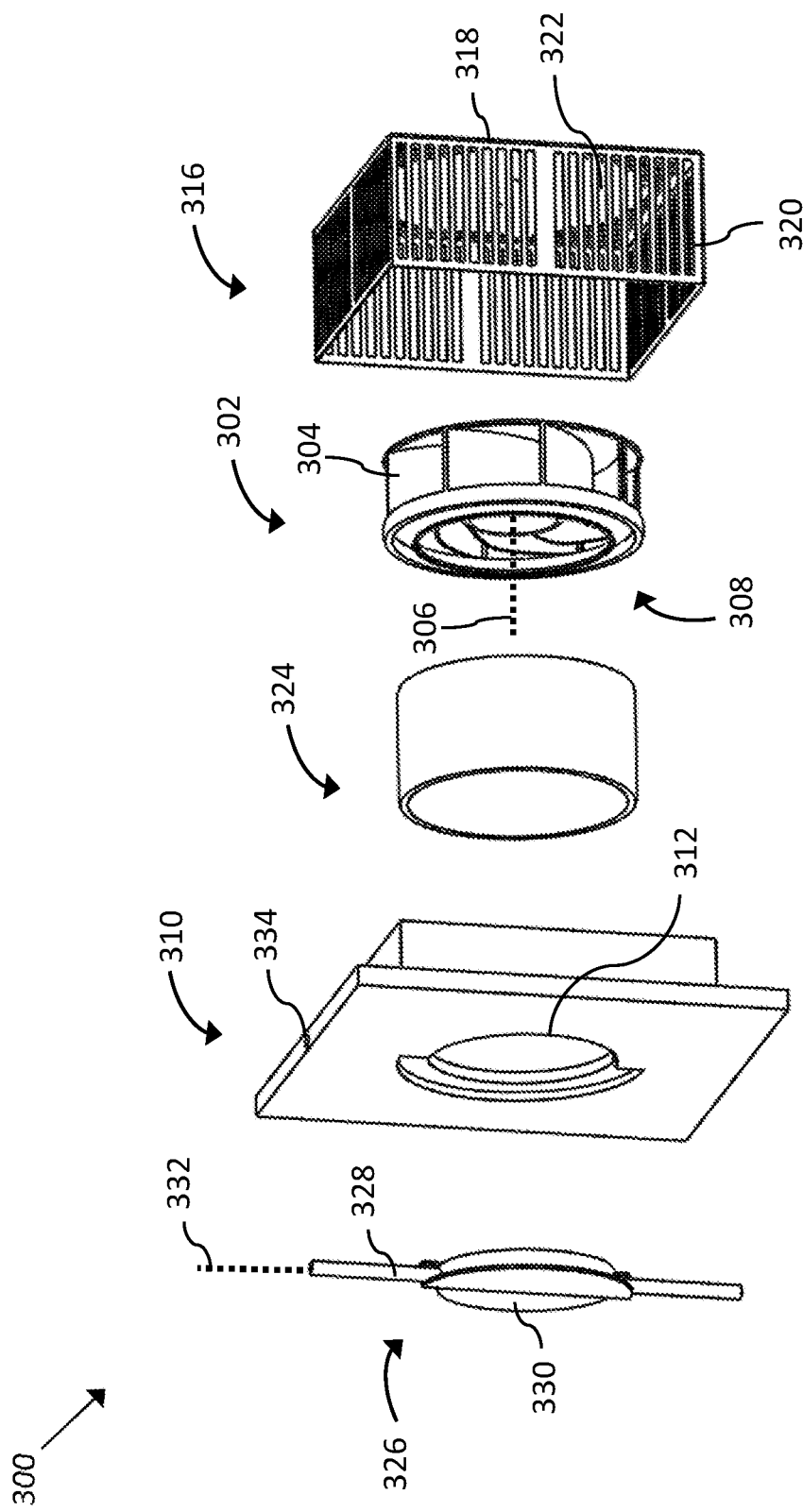
FIG. 4 shows an exploded, perspective view of a cooling assembly, in accordance with certain embodiments of the present disclosure.

FIG. 4 shows an exploded view of a cooling assembly 300, which can be installed in an enclosure such as the enclosure 104 of FIG. 1 and the enclosure 200 of FIGS. 2 and 3.

The cooling assembly 300 includes an air mover 302 (e.g., a fan unit such as a radial blower unit or an axial fan unit; a blower). The air mover 302 can include blades 304 shaped and arranged such that—when the blades 304 rotate around a rotation (or inlet) axis 306 (shown in dotted lines in FIG. 4)—the blades 304 pull air through an inlet side 308 of the air mover 302 and exhaust the air radially from the rotation axis 306. As such, when the cooling assembly 300 is installed to an enclosure like the cooling assemblies 216 of FIG. 3, the air is pulled from inside the enclosure 200 and exhausted in a radial direction outside the enclosure 200. In certain embodiments, the air mover 302 is a radial fan, which may be able to exhaust a larger volume of air for a given amount of power compared to air movers that are axial fans. The air mover 302 can include a motor that is electrically coupled to a power supply in an enclosure and that is coupled to the blades 304 to rotate the blades 304.

The cooling assembly 300 includes a member such as a vent panel 310 with an inlet opening 312. When the cooling assembly 300 is assembled, the vent panel 310 can be coupled to (e.g., clipped to, fastened to) another member such as a back cover 316. The back cover 316 includes a back wall 318 and four side walls 320 with exhaust openings 322 throughout the side walls 320. Although the back cover 316 is shown as including the side walls 320 and the exhaust openings 322, the vent panel 310 could include side walls and exhaust openings instead of or in addition to those of the back cover 316. Alternatively, a separate component could be coupled between the vent panel 310 and the back cover 316 and include exhaust openings, etc. The air mover 302 can be coupled to the back cover 316 via fasteners that extend through one or more of the rear mounting holes in the back cover 316 and couple to holes in the air mover 302. The cooling assembly 300 also includes an inlet ring 324 positioned between the air mover 302 and the vent panel 310. The inlet ring 324 can direct air entering the cooling assembly 300 through the inlet opening 312 to the air mover 302. In certain embodiments, the inlet ring 324 helps reduce or prevent the air mover 302 from pulling air through parts of the cooling assembly 300 other than through the inlet opening 312.

The cooling assembly 300 further includes a vent 326 (or vent assembly). The vent 326 includes a shaft 328 and a vane 330. When the vent 326 is coupled to the vent panel 310, the vent 326 is rotatable around a central vertical axis 332 of the vent 326 between an open position and a closed position to open and close (or otherwise seal) the inlet opening 312. In certain embodiments, the shaft 328 is coupled to the vent panel 310 such that the shaft 328 itself does not rotate within the vent panel 310. Instead, in such embodiments, the shaft 328 is stationary and the vane 330 is rotatably coupled to the shaft 328. For example, the shaft 328 may extend through an opening in the vane 330 such that the vane 330 is free to rotate around the shaft 328. In certain embodiments, the shaft 328 comprises a metallic material and the vane 330 comprises a plastic material so that, when the vane 330 rotates around the shaft 328, there is no metal-to-metal contact.

As shown in FIG. 4, in certain embodiments, the vent panel 310 includes only one inlet opening 312. In such embodiments, the cooling assembly 300 can include only one vent 326. When the vent 326 is installed in the cooling assembly 300, the shaft 328 extends through one or more gaps, holes, or openings 334 in the vent panel 310.

Figure 6:
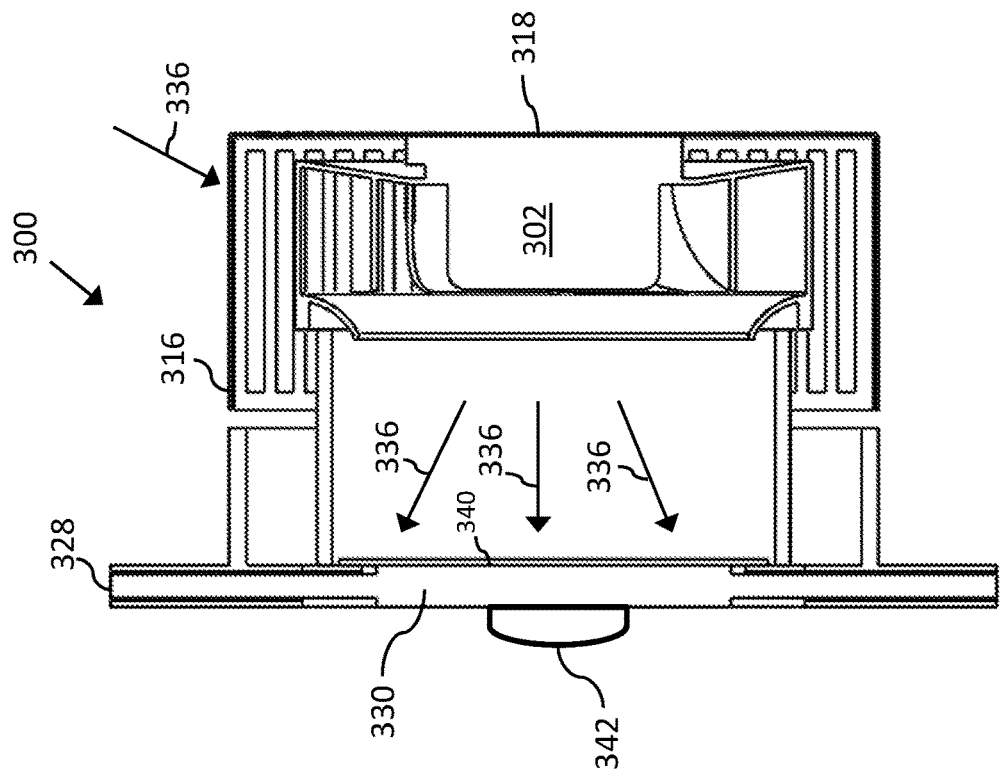
FIG. 6 shows a side, cut-away view of the cooling assembly of FIGS. 4 and 5 in the closed position, in accordance with certain embodiments of the present disclosure.
Figure 5:
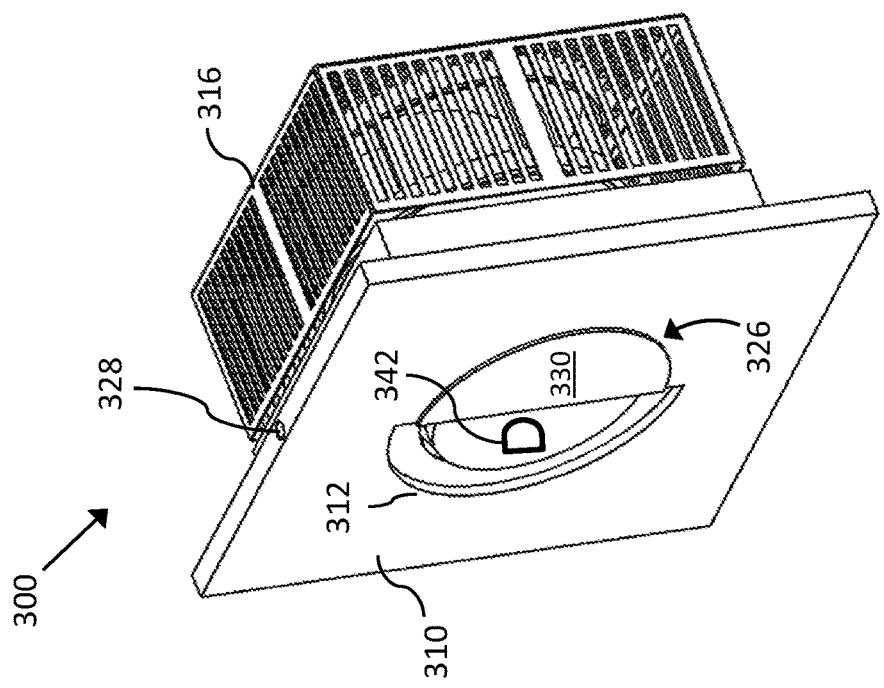
FIG. 5 shows a perspective view of the cooling assembly of FIG. 4 in a closed position, in accordance with certain embodiments of the present disclosure.
Figure 8:
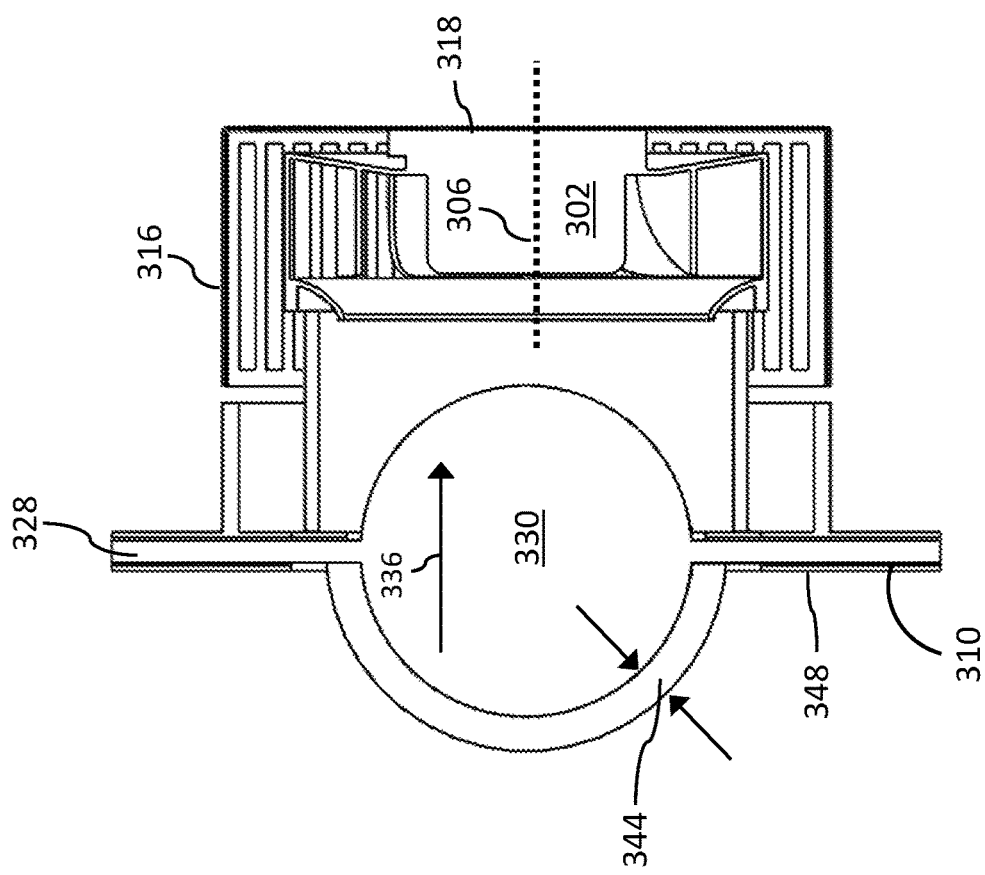
FIG. 8 shows a side, cut-away view of the cooling assembly of FIGS. 4-7 in the open position, in accordance with certain embodiments of the present disclosure.

FIGS. 5 and 6 show various views of the cooling assembly 300 when the vent 326 is in the closed position. In the closed position, the air mover 302 has malfunctioned or is otherwise not operating to its full capability such that air 336 (represented with arrows) is entering—instead of exiting—the cooling assembly 300 through the exhaust openings 322. For example, if an enclosure includes multiple cooling assemblies 300, the cooling assemblies 300 operating will create a negative pressure that pulls air in a reverse direction through the non-operating cooling assemblies 300.

As shown in FIG. 5, the vane 330 is shaped to match the shape of the inlet opening 312. In certain embodiments, the vane 330 and in the inlet opening 312 is circular-shaped. As such, when circular-shaped, approximately one half of the circular-shaped vane 330 can be positioned on one side of the shaft 328 approximately the other half of the circular-shaped vane 330 is positioned on the other side of the shaft 328, which can extend through a center of the vane 330.

In the closed position, the vent 326 is positioned such that the vent 326 (e.g., via the vane 330) closes or otherwise provides a seal with the inlet opening 312 in the vent panel 310 such that little to none of the air 336 passes through the inlet opening 312 and into an enclosure. For example, the vent 326 can be coupled to the vent panel 310 such that the air 336 cannot pass through the inlet opening 312. In certain embodiments, a gasket 338 (e.g., a tape-like gasket, which represented in FIG. 7) is applied to a surface of the vane 330 or near the outer perimeter of the vane 330 and/or applied to a surface of the vent panel 310 such that the gasket 338 helps provide a seal between the vane 330 and the vent panel 310.

The vent 326 rotates from the open position (shown in FIGS. 7-10 described below) to the closed position when the air mover 302 is not operating properly. When the air mover 302 is not operating, the air 336 flows in a reverse direction into the cooling assembly 300 (e.g., into the cooling assembly 300 through the exhaust openings 322).

In certain embodiments, the vane 330 includes an interior-facing surface 340 on one side of the shaft 328 that has a larger surface area than the interior-facing surface 340 on the other side of the shaft 328. The air 336 flowing in the reverse direction will create more pressure on the larger surface area side of the interior-facing surface 340 and will cause the vane 330 to rotate shut. Put another way, as the air 336 impinges on the interior-facing surface 340 of the vane 330, the vane 330 rotates (e.g., clockwise or counterclockwise) around the central vertical axis 332 and closes the inlet opening 312.

Additionally or alternatively, in certain embodiments, the vane 330 is coupled to or includes one or more pockets or cup-shaped structures 342 (e.g., structures with an opening on one side and closed on another side) that are arranged to "catch" the air 336 when the vane 330 is in the open position and help cause the vane 330 to rotate to the closed position. Put another way, the air 336 can flow into the one or more pockets 342 and provide a force that causes the vane 330 to rotate to the closed position. The pockets 342 can be arranged to "catch" the air 336 flowing in the reverse direction (e.g., via an open-side of the pocket 342) when the vent 326 is open but allow the air 336 to flow in a positive direction over the exterior surface of the pockets 342 (e.g., over a closed-side of the pocket 342) when the vent 326 is open.

Using the pockets 342 and/or the larger surface area, the vent 326 (e.g., via the vane 330) can rotate between the open position and the closed position without use of gravity. As such, in the open position, the air mover 302 can use less power to keep the vent 326 open compared to approaches that rely on gravity for closing flaps or wings when an air mover is not operating.

FIGS. 7-10 show various views of the cooling assembly 300 when the vent 326 is in the open position. In the open position, the air mover 302 is operating and drawing the air 336 into the cooling assembly 300 through the inlet opening 312 in the vent panel 310, through the inlet ring 324, through the air mover 302, and out of the cooling assembly 300 through the exhaust openings 322. When the vent 326 is in the open position, the air 336 can flow parallel to the rotation axis 306 (shown in FIGS. 8 and 10). This parallel airflow can reduce overall turbulent air flow, which allows the air mover 302 to operate more efficiently. As shown in FIG. 10, in the open position, the vane 330 can be rotated 90 degrees from the closed position. For example, the interior-facing surface 340 of the vane 330 can extend perpendicular to a plane of a front surface 348 of the vent panel 310. As such, the air 336 can flow through the inlet opening 312 on both sides of the vane 330.

Figure 7:
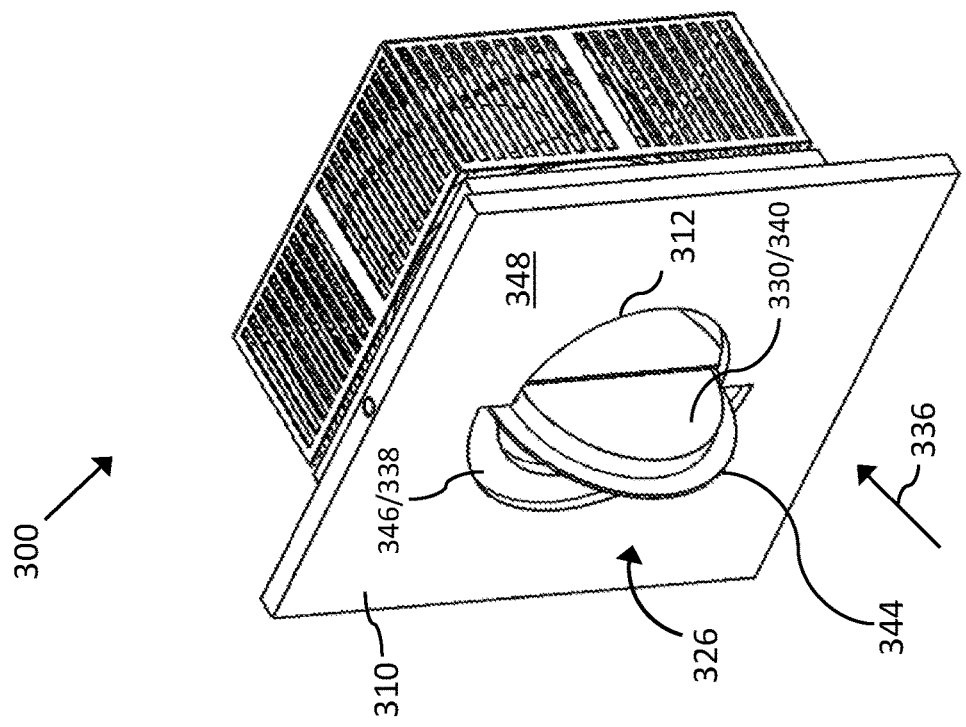
FIG. 7 shows a perspective view of the cooling assembly of FIGS. 4-6 in an open position, in accordance with certain embodiments of the present disclosure.

As shown in FIG. 7, the vane 330 includes an outer lip portion 344. When the vane 330 is in the closed position, the outer lip portion 344 can overlap with a recessed surface 346 of the vent panel 310. The recessed surface 346 can be recessed from the front surface 348 of the vent panel 310. In certain embodiments, the outer lip portion 344 extends around only a portion (e.g., approximately half) of the vane 330.

The cooling assembly 300 shown in the figures and described above provides approaches for limiting the back flow of air through the cooling assembly 300 in the event the air mover 302 fails or misfunctions. The cooling assemblies 300 can include the vent 326 that opens and closes (e.g., via the vane 330) based on the flow of air impinging on the vent 326 (e.g., positive or negative flow). Further, the vent 326 can open and close via positive or negative air flow without necessarily using the force of gravity. While the disclosure illustrates the cooling of a data storage enclosure, in other embodiments the cooling assembly 300 may be used to other types of enclosures such as enclosures that feature electronics other than data storage devices (e.g., processors, power supply units).

Figure 11:
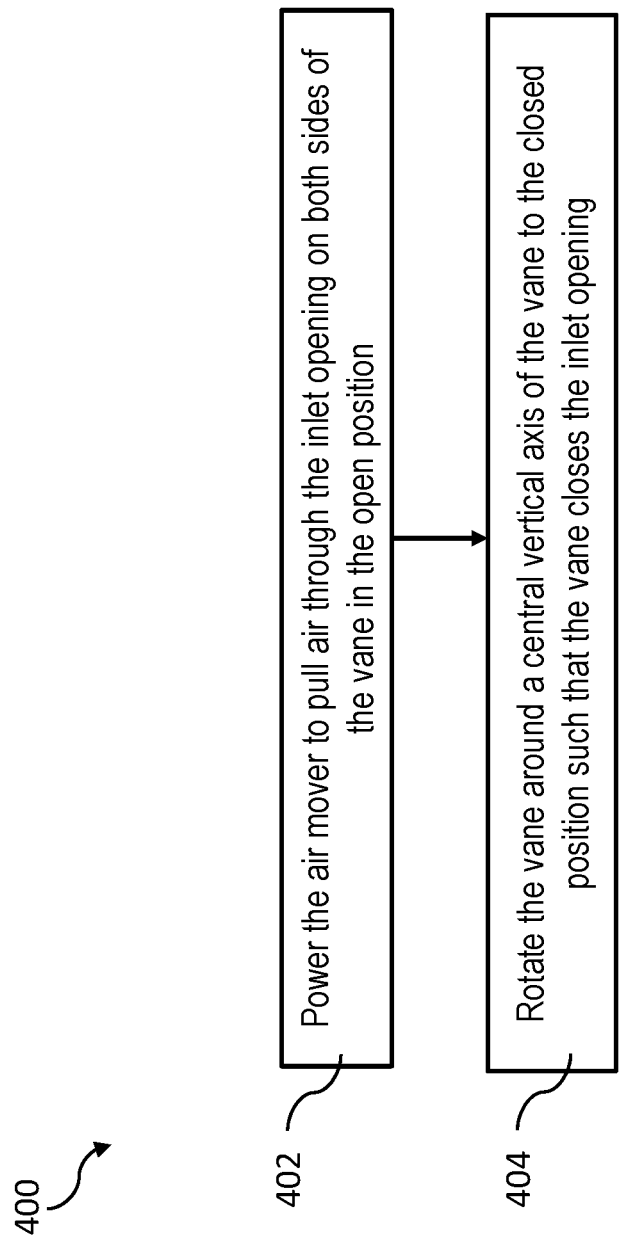
FIG. 11 shows a block diagram of steps of a method, in accordance with certain embodiments of the present disclosure.

FIG. 11 shows a block diagram of a method 400 for using the cooling assembly 300 described above. The method 400 includes powering the air mover 302 to pull air through the inlet opening 312 on both sides of the vane 330 in the open position (block 402 in FIG. 11). The method 400 also includes rotating the vane 330 around the central vertical axis 332 of the vane 330 to the closed position such that the vane 330 closes the inlet opening 312 (block 404 in FIG. 11).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

I claim:

1. A cooling assembly comprising:
   an air mover;
   a vent panel coupled to the air mover and including an inlet opening;
   a shaft; and
   a vane coupled to the shaft and rotatable around a central vertical axis of the vane between an open position and a closed position to open and close the inlet opening, wherein the cooling assembly includes only one vane, wherein the vane includes a pocket that extends from an exterior surface of the vane.

2. The cooling assembly of claim 1, wherein the vent panel includes only one inlet opening.

3. The cooling assembly of claim 1, wherein the vane is shaped to close the inlet opening of the vent panel.

4. The cooling assembly of claim 3, wherein the vane is a circle.

5. The cooling assembly of claim 4, wherein approximately half of the circle is positioned on one side of the shaft, wherein approximately another half of the circle is positioned on another side of the shaft.

6. The cooling assembly of claim 1, wherein a portion of the vane is positioned on one side of the shaft has a larger surface area than a portion of the vane positioned on another side of the shaft.

7. The cooling assembly of claim 1, wherein the shaft extends through a center of the vane.

8. The cooling assembly of claim 1, wherein the shaft extends through a hole in the vent panel.

9. The cooling assembly of claim 1, wherein the vane is rotatable around the shaft, wherein the shaft is stationary with respect to the vent panel.

10. The cooling assembly of claim 1, wherein the air mover is a radial fan unit.

11. The cooling assembly of claim 1, wherein the vane rotates between the open position and the closed position without use of gravity.

12. The cooling assembly of claim 1, further comprising an inlet ring positioned between the air mover and the vent panel.

13. The cooling assembly of claim 1, wherein the pocket includes an opening on one side of the pocket and is closed on another side and is arranged such that reverse-flowing air can flow into the opening of the pocket.

14. A system comprising:
an enclosure; and
a first cooling assembly coupled to the enclosure and including:
   a first air mover;
   a first vent panel coupled to the first air mover and including a first inlet opening;
   a first shaft extending vertically; and
   a first vane rotatable around the first shaft and a first vertical axis between a first open position and a first closed position to open and close the first inlet opening, wherein the first vane includes a pocket that extends from an exterior surface of the first vane.

15. The system of claim 14, further comprising:
a second cooling assembly coupled to the enclosure and including:
   a second air mover;
   a second vent panel coupled to the second air mover and including a second inlet opening;
   a second shaft extending vertically; and
   a second vane rotatable around second shaft and a second vertical axis between a second open position and a second closed position to open and close the second inlet opening.

16. The system of claim 15, wherein a majority of the first cooling assembly and the second cooling assembly are positioned outside the enclosure.

17. The system of claim 15, wherein the first cooling assembly and the second cooling assembly are attached to a back wall of the enclosure.

18. The system of claim 14, wherein a portion of the first vane is positioned on one side of the first shaft has a larger surface area than a portion of the first vane positioned on another side of the first shaft, wherein the first cooling assembly includes only one vane.

19. A method of using a cooling assembly that includes an air mover, a vent panel with an inlet opening, and a vane rotatable between an open position and a closed position to open and close the inlet opening, the vane including a pocket that extends from an exterior surface of the vane, the method comprising:
   powering the air mover to pull air through the inlet opening in a forward-flowing direction on both sides of the vane in the open position; and
   rotating the vane around a central vertical axis of the vane to the closed position such that the vane closes the inlet opening, wherein the rotating is caused by reverse-flowing air flowing into the pocket.

* * * * *